US012622314B2

(12) United States Patent
Chen et al.

(10) Patent No.: US 12,622,314 B2
(45) Date of Patent: May 5, 2026

(54) DAM STRUCTURE FOR INTEGRATED PASSIVE DEVICE INTEGRATION AND METHODS OF FORMING THE SAME

(71) Applicant: Taiwan Semiconductor Manufacturing Company Limited, Hsinchu (TW)

(72) Inventors: Hsien-Wei Chen, Hsinchu City (TW); Meng-Liang Lin, Hsinchu (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 507 days.

(21) Appl. No.: 17/718,569

(22) Filed: Apr. 12, 2022

(65) Prior Publication Data

US 2023/0326819 A1    Oct. 12, 2023

(51) Int. Cl.
| | |
|---|---|
| *H01L 23/16* | (2006.01) |
| *H01L 21/48* | (2006.01) |
| *H01L 21/56* | (2006.01) |
| *H01L 23/00* | (2006.01) |

(Continued)

(52) U.S. Cl.
CPC .......... *H01L 23/16* (2013.01); *H01L 21/4853* (2013.01); *H01L 21/4857* (2013.01); *H01L 21/563* (2013.01); *H01L 21/568* (2013.01); *H01L 23/3185* (2013.01); *H01L 23/49827* (2013.01); *H01L 23/49838* (2013.01); *H01L 24/16* (2013.01); *H01L 2224/16227* (2013.01);

(Continued)

(58) Field of Classification Search
None
See application file for complete search history.

(56) References Cited

U.S. PATENT DOCUMENTS

| | | | | |
|---|---|---|---|---|
| 2010/0327457 | A1* | 12/2010 | Mabuchi | H01L 24/32 |
| | | | | 257/773 |
| 2019/0131284 | A1* | 5/2019 | Jeng | H01L 24/92 |
| 2019/0139786 | A1* | 5/2019 | Yeh | H01L 24/81 |

(Continued)

OTHER PUBLICATIONS

Taiwan Intellectual Property Bureau of the Ministry of Economic Affairs; TW application No. 112105911; Office Action of Apr. 12, 2024; 14 pages.

*Primary Examiner* — Cory W Eskridge
(74) *Attorney, Agent, or Firm* — The Marbury Law Group, PLLC

(57) ABSTRACT

An embodiment semiconductor package assembly may include an interposer, an integrated passive device electrically coupled to a first side of the interposer, an underfill material portion formed between the integrated passive device and the first side of the interposer, and a dam protruding from the first side of the interposer and configured to constrain a spatial extent of the underfill material portion. The dam may include a first portion extending above a surface of the first side of the interposer and a second portion embedded below the surface of the first side of the interposer. The dam may be formed in a dielectric layer that also includes a component of a redistribution interconnect structure. The dam may further be electrically isolated from the redistribution interconnect structure and may be configured to form a connected or disconnected boundary of a two-dimensional region of the first side of the interposer.

20 Claims, 12 Drawing Sheets

(51) Int. Cl.
      H01L 23/31          (2006.01)
      H01L 23/498         (2006.01)
(52) U.S. Cl.
      CPC ............... *H01L 2924/18161* (2013.01); *H01L 2924/19103* (2013.01); *H01L 2924/351* (2013.01)

(56)                References Cited

U.S. PATENT DOCUMENTS

2020/0381383  A1*  12/2020  Hsu ..................... H01L 21/4846
2021/0391230  A1*  12/2021  Lu ....................... H01L 21/4885
2021/0391232  A1    12/2021  Jain et al.
2022/0102233  A1*   3/2022  Tsai ................... H01L 23/3128

* cited by examiner

300

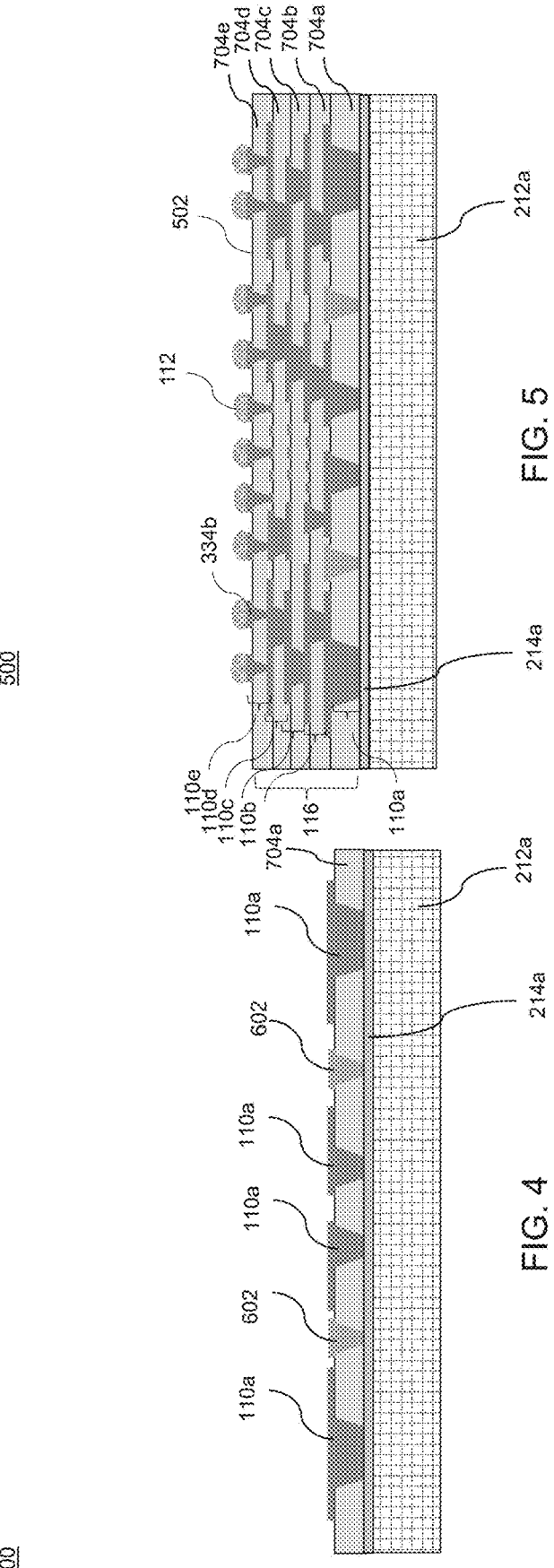

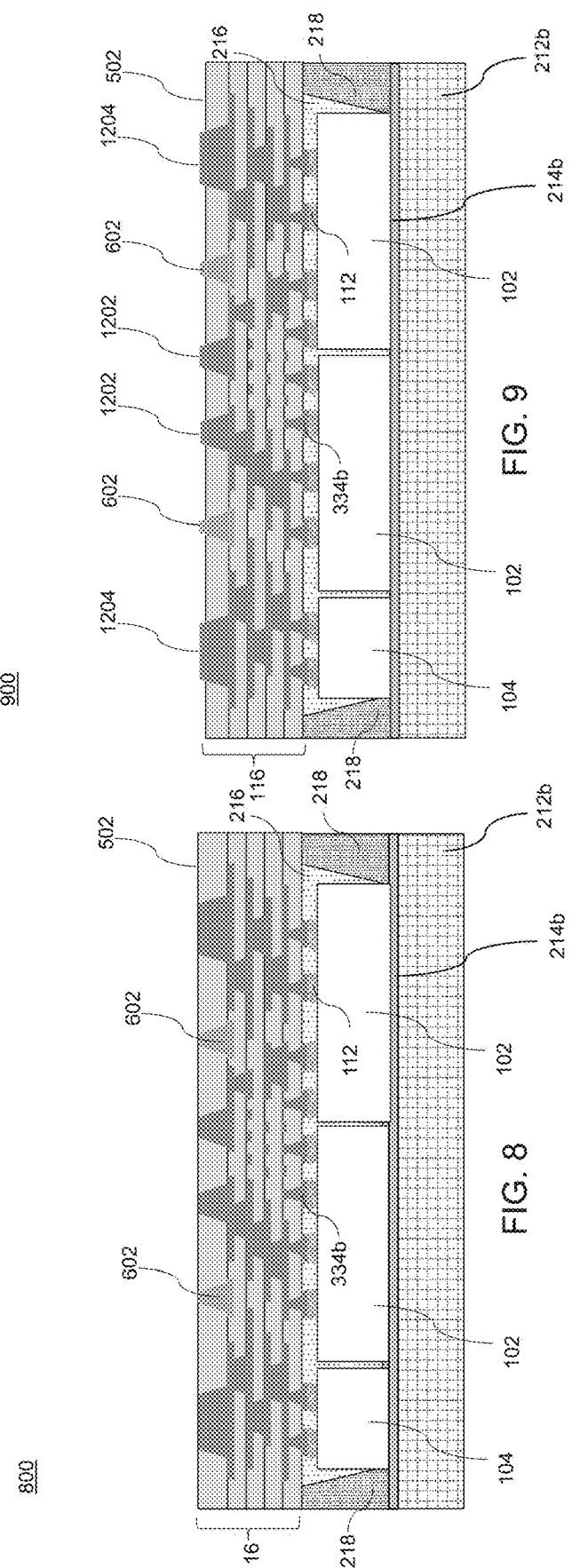

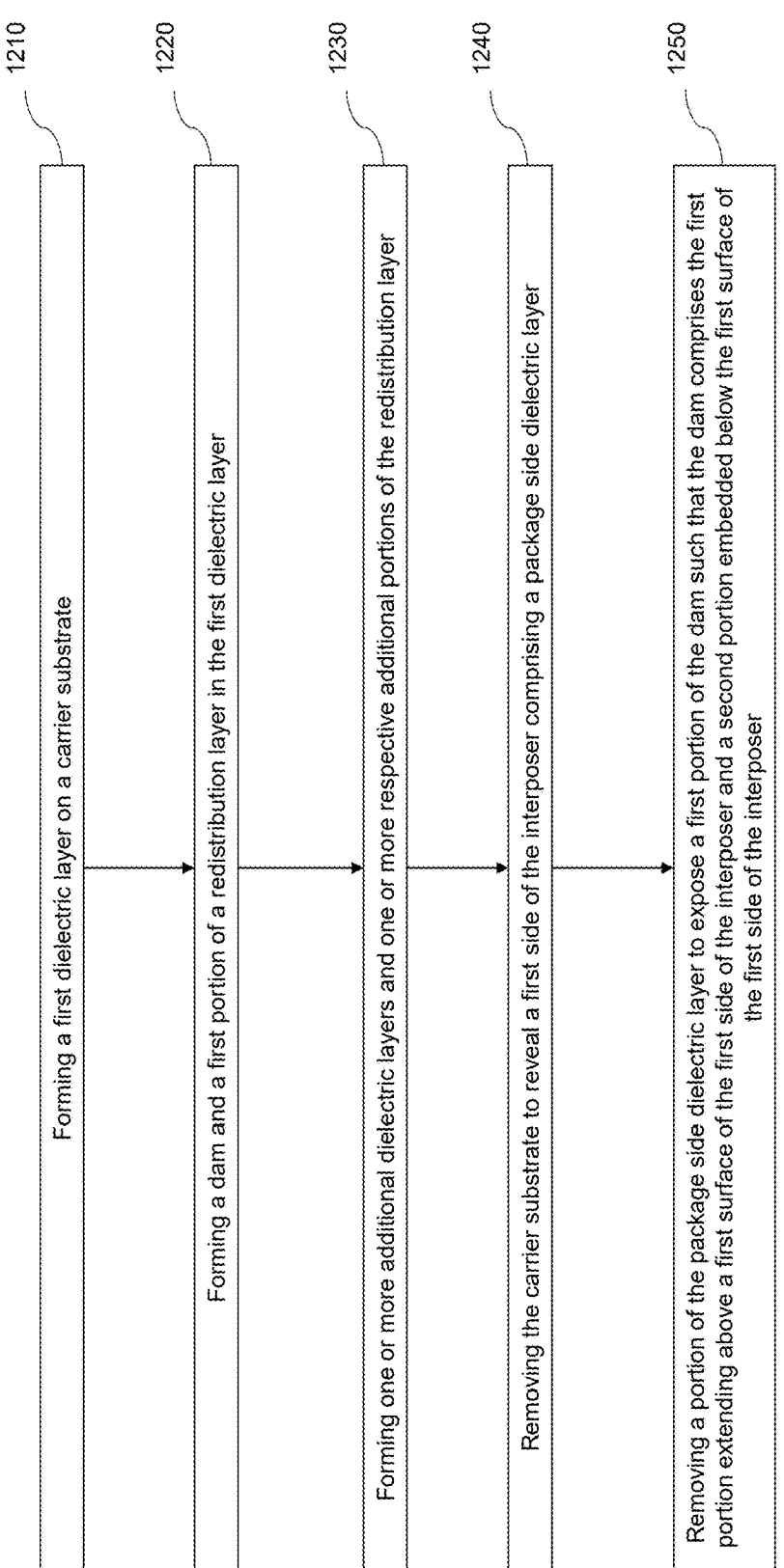

FIG. 12

1210 — Forming a first dielectric layer on a carrier substrate

1220 — Forming a dam and a first portion of a redistribution layer in the first dielectric layer 1230 — Forming one or more additional dielectric layers and one or more respective additional portions of the redistribution layer 1240 — Removing the carrier substrate to reveal a first side of the interposer comprising a package side dielectric layer 1250 — Removing a portion of the package side dielectric layer to expose a first portion of the dam such that the dam comprises the first portion extending above a first surface of the first side of the interposer and a second portion embedded below the first surface of the first side of the interposer

1200

DAM STRUCTURE FOR INTEGRATED PASSIVE DEVICE INTEGRATION AND METHODS OF FORMING THE SAME

BACKGROUND

The semiconductor industry has grown due to continuous improvements in integration density of various electronic components (e.g., transistors, diodes, resistors, capacitors, etc.). For the most part, these improvements in integration density have come from successive reductions in minimum feature size, which allows more components to be integrated into a given area.

In addition to smaller electronic components, improvements to the packaging of components have been developed in an effort to provide smaller packages that occupy less area than previous packages. Such packaging improvements may include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a vertical cross-sectional view of an intermediate structure that may be used in the formation of a semiconductor package assembly, according to various embodiments.

FIG. 5 is a vertical cross-sectional view of a further intermediate structure that may be used in the formation of a semiconductor package assembly, according to various embodiments.

FIG. 8 is a vertical cross-sectional view of a further intermediate structure that may be used in the formation of a semiconductor package assembly, according to various embodiments.

FIG. 9 is a vertical cross-sectional view of a further intermediate structure that may be used in the formation of a semiconductor package assembly, according to various embodiments.

FIG. 12 is a flowchart showing various operations of a method of fabricating semiconductor device structure, according to various embodiments.

DETAILED DESCRIPTION

Figure 1A:
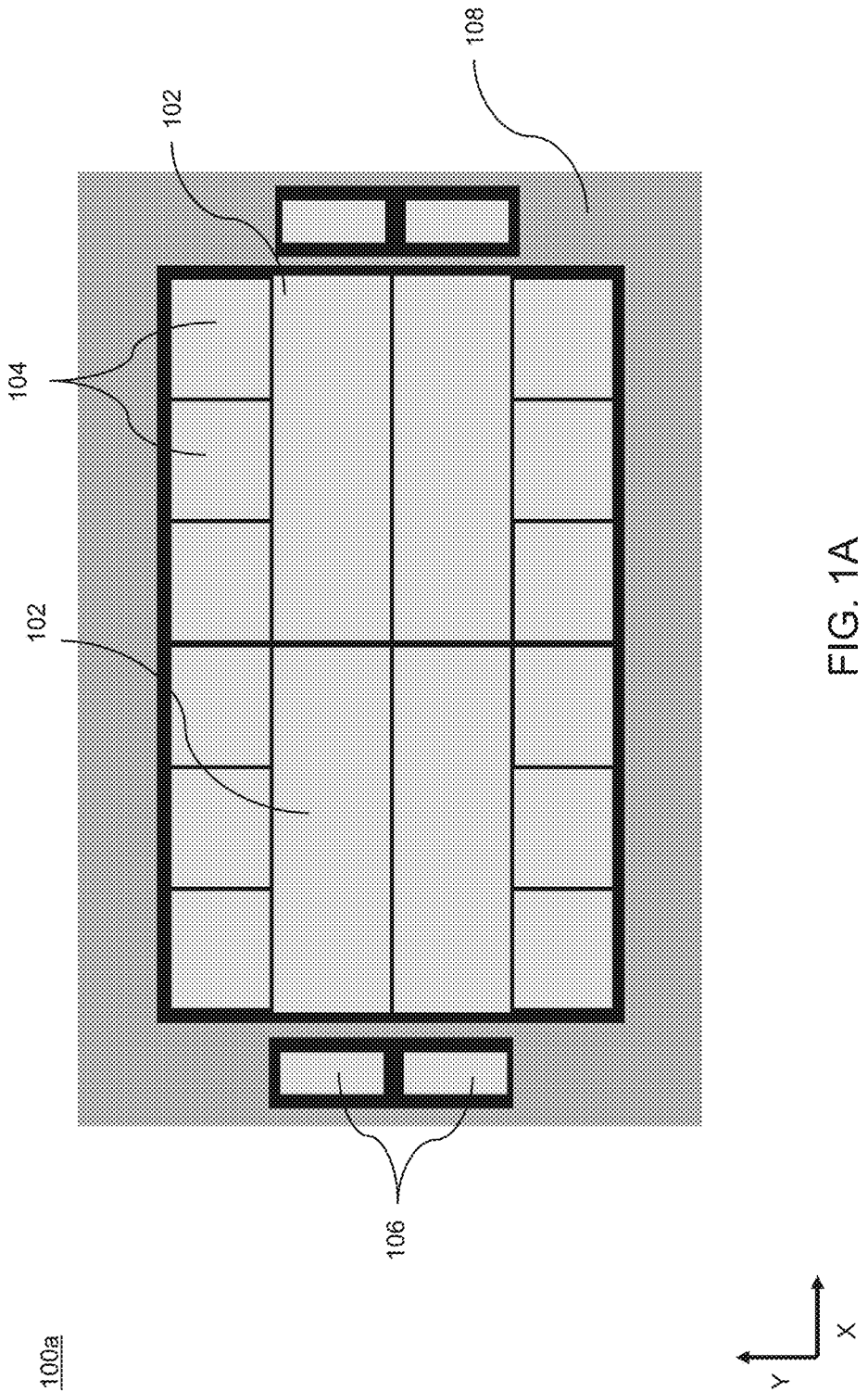
FIG. 1A is top view of a semiconductor device, according to various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The various embodiments disclosed herein provide improved methods for attaching an integrated passive device to an interposer for use in a semiconductor package assembly. After attaching an integrated passive device to an interposer, an underflow material may be formed between the integrated passive device and the first side of the interposer. A dam formed in the interposer may be configured to constrain a spatial extent of the underfill material portion. As such, the underfill material portion may be prevented from overlapping with adjacent bonding structures, which may otherwise reduce performance of the semiconductor package assembly. In certain embodiments, the dam may include disconnected segments, which may be advantageous in reducing stresses due to thermal expansion during various processing steps. Further, in some embodiments, the dam may be fabricated along with redistribution interconnect layers with minimal modifications to existing fabrication processes.

An embodiment semiconductor package assembly may include an interposer, an integrated passive device electrically coupled to a first side of the interposer, an underfill material portion formed between the integrated passive device and the first side of the interposer, and a dam protruding from the first side of the interposer and configured to constrain a spatial extent of the underfill material portion. The dam may include a first portion extending above a surface of the first side of the interposer and a second portion embedded below the surface of the first side of the interposer. The dam may be formed in a dielectric layer that also includes a component of a redistribution interconnect structure. The dam may further be electrically isolated from the redistribution interconnect structure and may be configured to form a connected or disconnected boundary of a two-dimensional region of the first side of the interposer.

In a further embodiment, an interposer may be provided. The interposer may include one or more dielectric layers, a redistribution interconnect structure formed in the one or more dielectric layers, a first plurality of bonding structures formed on a first side of the interposer and electrically connected to the redistribution interconnect structure, with the first plurality of bonding structures configured to electrically connect an integrated passive device to the interposer, and a dam protruding from the first side of the interposer. The dam may be formed in the interposer and may be partially embedded in a dielectric layer that also includes a component of the redistribution interconnect structure. The interposer may further include the integrated passive device coupled to the first side of the interposer and electrically connected to the first plurality of bonding structures, and an underfill material portion formed in a volume between the integrated passive device and the first side of the interposer, such that the dam is configured to constrain a spatial extent of the underfill material portion.

In a further embodiment, a method of forming a semiconductor package assembly is provided. The method may include forming an interposer by performing operations including: forming a first dielectric layer on a carrier substrate, forming a dam and a first portion of a redistribution interconnect structure in the first dielectric layer, forming one or more additional dielectric layers and one or more respective additional portions of the redistribution interconnect structure, removing the carrier substrate to reveal a first side of the interposer including a package side dielectric layer, and removing a portion of the package side dielectric layer to expose a first portion of the dam such that the dam includes the first portion extending above the first side of the interposer and a second portion embedded below the first side of the interposer. The method may further include forming a first plurality of bonding structures on the redistribution interconnect structure such that the first plurality of bonding structures are configured to protrude from the first side of the interposer, electrically connecting an integrated passive device to the first plurality of bonding structures, and dispensing an underfill material portion such that the underfill material portion is configured to form in a volume between the integrated passive device and the first side of the interposer, and such that the dam is configured to constrain a spatial extent of the underfill material portion.

FIG. 1A is top view of a semiconductor device 100a, according to various embodiments. The semiconductor device 100a may include one or more integrated circuit (IC) semiconductor devices. For example, the semiconductor device 100a may include a first plurality of semiconductor dies 102 and a second plurality of semiconductor dies 104. In various embodiments, each of first plurality of semiconductor dies 102 may be configured as a three-dimensional device, such as a three-dimensional integrated circuit (3DICs), a system-on-chip (SOC) device, or a system-on-integrated-circuit (SoIC) device. The semiconductor device 100a may further include one or more additional semiconductor dies 106. For example, the one or more additional semiconductor dies 106 may be an integrated passive device (e.g., containing passive components such as capacitors, inductors, resistors, etc.) or other component, as described in greater detail below with reference to FIG. 3.

Each of first plurality of semiconductor dies 102 may be formed by placing chips over chips on a semiconductor wafer level to form three-dimensional devices. These three-dimensional devices may provide improved integration density and other advantages, such as faster speeds and higher bandwidths, due to a decreased length of interconnects between the stacked chips. In some embodiments, each one of the first plurality of semiconductor dies 102 may also be referred to as a "first die stack." In some embodiments, each of the first plurality of semiconductor dies 102 may be dies or chips, such as logic dies, or power management dies.

In the semiconductor device 100a of FIG. 1A, the first plurality of semiconductor dies 102 may include four first die stacks, each of which may be configured as a SOC device. In various embodiments, each of first plurality of semiconductor dies 102 may be adjacent to one another and may be located in a central portion of the semiconductor device 100a. The second plurality of semiconductor dies 104 may be located on a periphery around the first plurality of semiconductor dies 102, as shown in FIG. 1A.

In this example embodiment, the second plurality of semiconductor dies 104 may include twelve semiconductor dies. In some embodiments, the second plurality of semiconductor dies 104 may be three-dimensional IC semiconductor devices, and may also be referred to as "second die stacks." In some embodiments, the second plurality of semiconductor dies 104 may each be a semiconductor memory device, such as a high bandwidth memory (HBM) device. Although first plurality of semiconductor dies 102 includes four (4) semiconductor dies and the second plurality of semiconductor dies 104 includes twelve (12) semiconductor dies, greater or fewer die stacks may be included in the semiconductor device 100a, 100b, 100c in other embodiments.

Figure 1B:
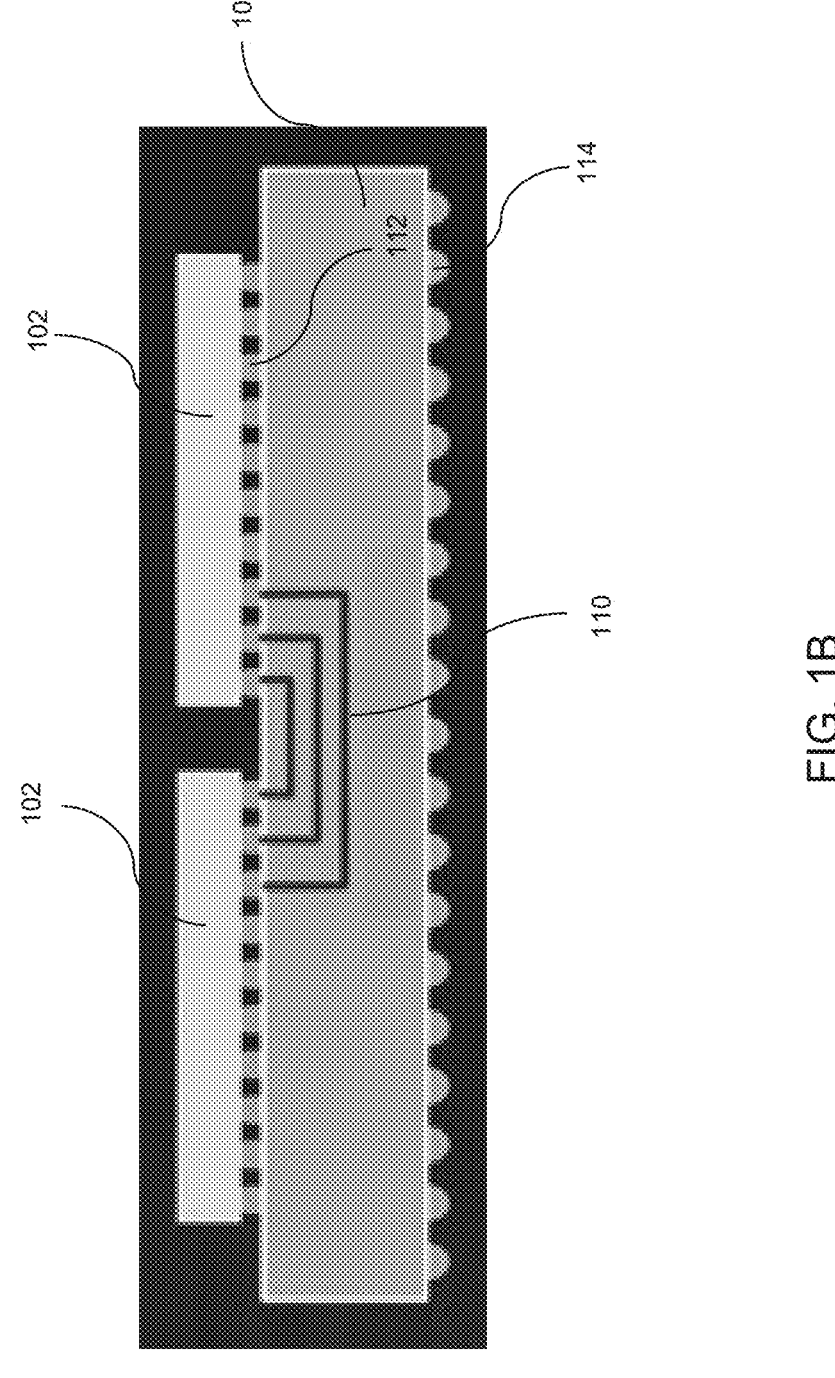
FIG. 1B is a vertical cross-sectional view of a semiconductor device, according to various embodiments.

FIG. 1B is a vertical cross-sectional view of a semiconductor device 100b, according to various embodiments. As shown, the semiconductor device 100b may include the first plurality of semiconductor dies 102 mounted to a package substrate 108. The package substrate 108 may include a suitable material, such as a semiconductor material (e.g., a semiconductor wafer, such as a silicon wafer), a ceramic material, an organic material (e.g., a polymer and/or thermoplastic material), a glass material, combinations thereof, etc. Other suitable substrate materials are within the contemplated scope of this disclosure. In various embodiments, the package substrate 108 may include a redistribution interconnect structure 110.

The first plurality of semiconductor dies 102 may be electrically coupled to the package substrate 108 via a first plurality of solder portions 112 that connect respective bonding pads or micro-bumps (not shown) of the respective first plurality of semiconductor dies 102 and the package substrate 108. The redistribution interconnect structure 110 may be configured to electrically couple each of the first plurality of semiconductor dies 102 to one another and to allow signal propagation therebetween. The package substrate 108 may further be electrically coupled to a printed circuit board (PCB) (not shown) via a second plurality of solder portions 114 that connect respective bump structures of the package substrate 108 and PCB.

Figure 1C:
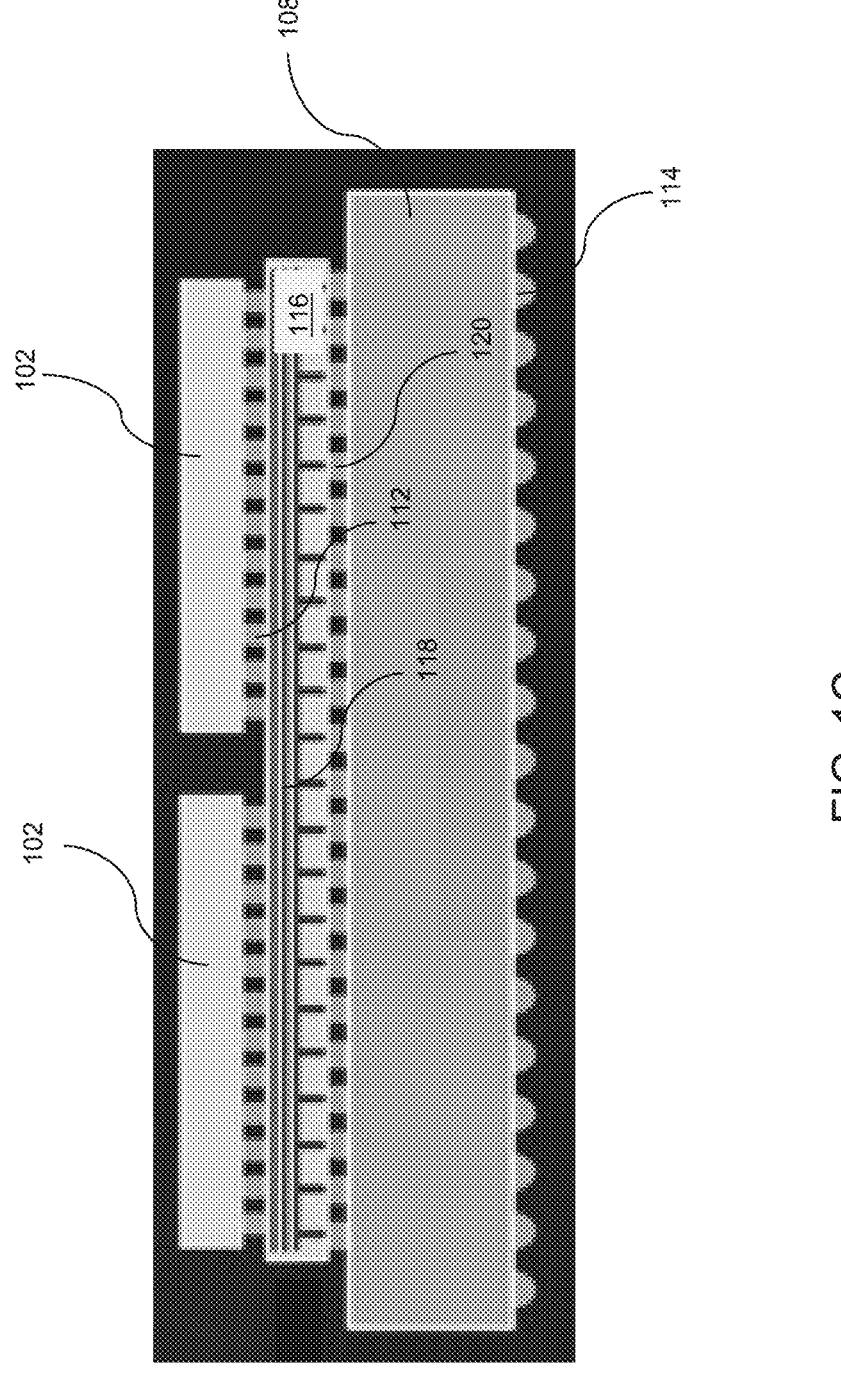
FIG. 1C is a vertical cross-sectional view of a further semiconductor device, according to various embodiments.

FIG. 1C is a vertical cross-sectional view of a further semiconductor device 100c, according to various embodiments. The semiconductor device 100c may include an interposer 116 having a redistribution interconnect structure 118. The first plurality of semiconductor dies 102 may be electrically coupled to the interposer 116 via a plurality of solder portions 112 that connect respective bonding pads or micro-bumps (not shown) of each of the first plurality of semiconductor dies 102 and the interposer 116. The semiconductor device 100c, including the first plurality of semiconductor dies 102 and the interposer 116, may further be coupled to a package substrate 108 via solder portions 120 that may couple respective bonding pads or bump structure of the interposer 116 and the package substrate 108.

The package substrate 108 may further be electrically coupled to a printed circuit board (PCB) (not shown) via solder portions 114 that connect respective bump structures of the package substrate 108 and PCB. The semiconductor device 100c may be similar to various other structures described in greater detail below. For example, the interposer 116 may be an organic interposer. Alternatively, the interposer 116 may be a silicon interposer.

Figures 2A, 2B:
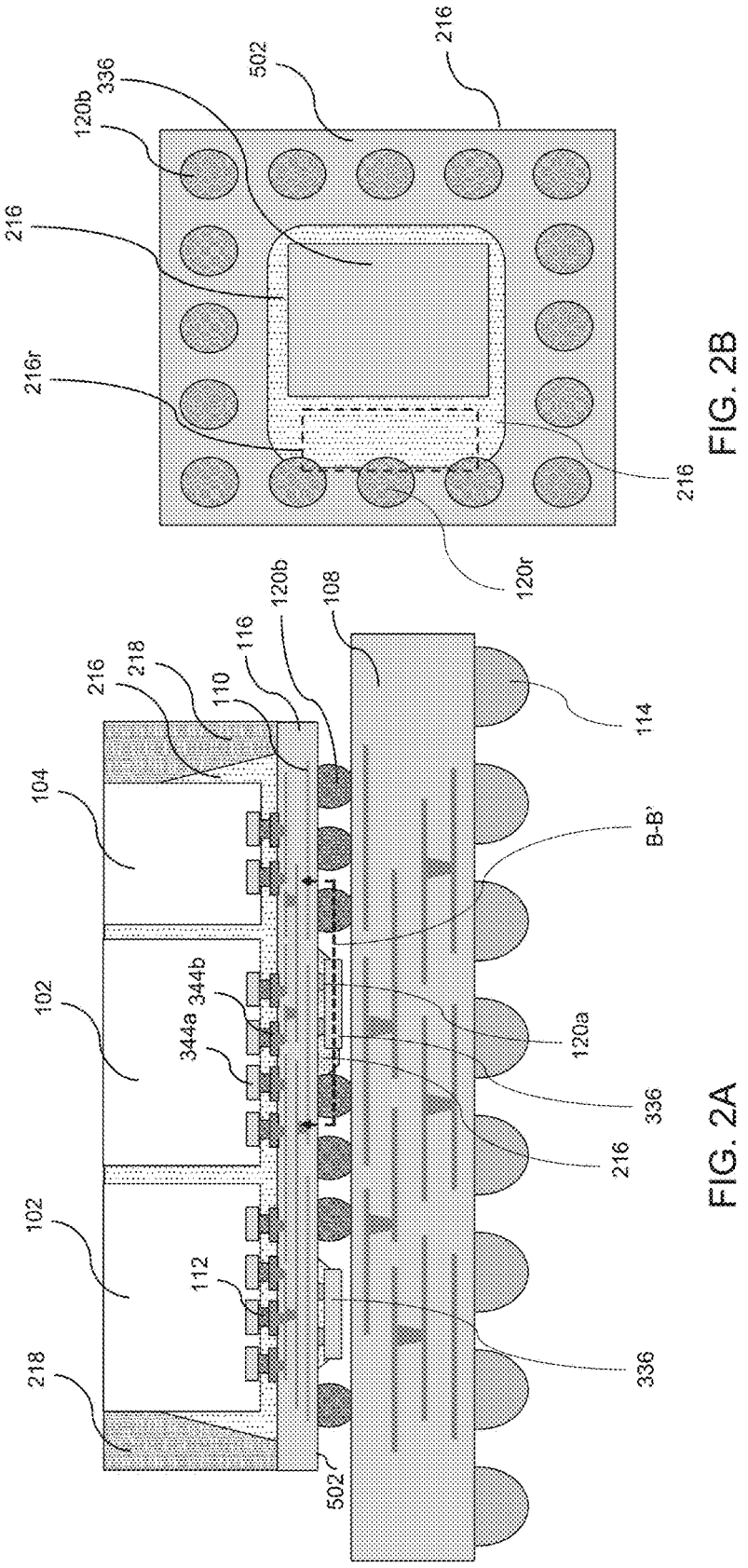
FIG. 2A is a vertical cross-sectional view of an exemplary semiconductor package assembly having a fan-out wafer-level package including a plurality of semiconductor dies and an integrated passive device die, according to various embodiments.
FIG. 2B is a bottom view of a portion of the exemplary semiconductor package assembly of FIG. 2A such that the plane of the figure is parallel to the cross sectional plane B-B' shown in FIG. 2A, according to various embodiments.

FIG. 2A is a vertical cross-sectional view of an exemplary semiconductor package assembly 200 including a plurality of semiconductor dies (102,104) and an integrated passive device 336, according to various embodiments. The exemplary semiconductor package assembly 200 may include an interposer 116 having a redistribution interconnect structure 110. The plurality of semiconductor dies (102, 104) may be electrically coupled to the interposer 116 with a plurality of solder portions 112 that connect respective bonding pads (344a, 344b) of the respective semiconductor dies (102, 104) and the interposer 116.

The integrated passive device 336 may similarly be electrically coupled to the interposer 116 via a plurality of solder portions 120a that connect respective bonding pads or micro-bumps (not shown) of the respective integrated passive device 336 and the interposer 116. As described above, at least one underfill material portion 216 may be formed around each bonded array of solder portions (112, 120a). Further, an epoxy molding compound (EMC) may be applied to gaps formed between the interposer 116, the semiconductor dies (102, 104), and the integrated passive device 336 to thereby form a multi-die EMC frame 218.

The exemplary semiconductor package assembly 200 including the plurality of semiconductor dies (102, 104), the interposer 116, and integrated passive device 336 may further be coupled to a package substrate 108 via solder portions 120b that may couple respective bonding pads or bump structures (not shown) of the respective interposer 116 and the package substrate 108. The package substrate 108 may further be electrically coupled to a PCB (not shown) via solder portions 114 that connect respective bump structures of the package substrate 108 (not shown) and the PCB.

The exemplary semiconductor package assembly 200 may be similar to various other structures described above. For example, the interposer 116 may be an organic interposer. Alternatively, the interposer 116 may be a silicon interposer. The integrated passive device 336 may be configured in various ways. For example, the integrated passive device 336 may include one or more passive components such as capacitors, inductors, resistors, etc. . . . Further, the integrated passive device 336 may be coupled to a bottom surface of the interposer 116, as shown in FIGS. 2A and 2B. Alternatively, the integrated passive device 336 may be coupled to a top surface of the interposer.

FIG. 2B is a bottom view of a portion of the exemplary semiconductor package assembly 200 of FIG. 2A such that the plane of the figure is parallel to the cross sectional plane B-B' shown in FIG. 2A, according to various embodiments. In this regard, a portion of a first side 502 of the interposer 116 is shown. The portion of the first side 502 may include a plurality of solder portions 120b and the integrated passive device 336 coupled to the bottom surface of the interposer 116. As described above, the integrated passive device 336 may be coupled to the first side 502 of the interposer 116 by performing a reflow operation to join the solder portions 120a (e.g., see FIG. 2A) to respective bonding pad or bumps (not shown) of the integrated passive device 336 and the interposer 116.

The at least one underfill material portion 216 may be formed by injecting an underfill material around the integrated passive device 336. In this way, the at least one underfill material portion 216 may be formed between the integrated passive device 336 and the first side 502 of the interposer 116 after the solder portions 120a (e.g., see FIG. 2A) that are located between the integrated passive device 336 and the interposer 116 are reflowed. Any of a variety of underfill material application methods may be used, which may include, for example, a capillary underfill method, a molded underfill method, or a printed underfill method. In certain embodiments, the underfill material portion 216 may extend into a region 216r that may physically contact a subset of the solder portions 120r. The presence of the region 216r of the underfill material portion 216 may degrade the performance of the subset of the solder portions 120r that are affected by the region 216r of the underfill material portion 216. In certain situations, the presence of the region 216r of the underfill material portion 216 may render inoperable the subset of the solder portions 120r. As such, it may be advantageous to provide an additional physical structure that may act to constrain a spatial extent of the underfill material portion 216, as described in greater detail below.

Figures 3A, 3B:
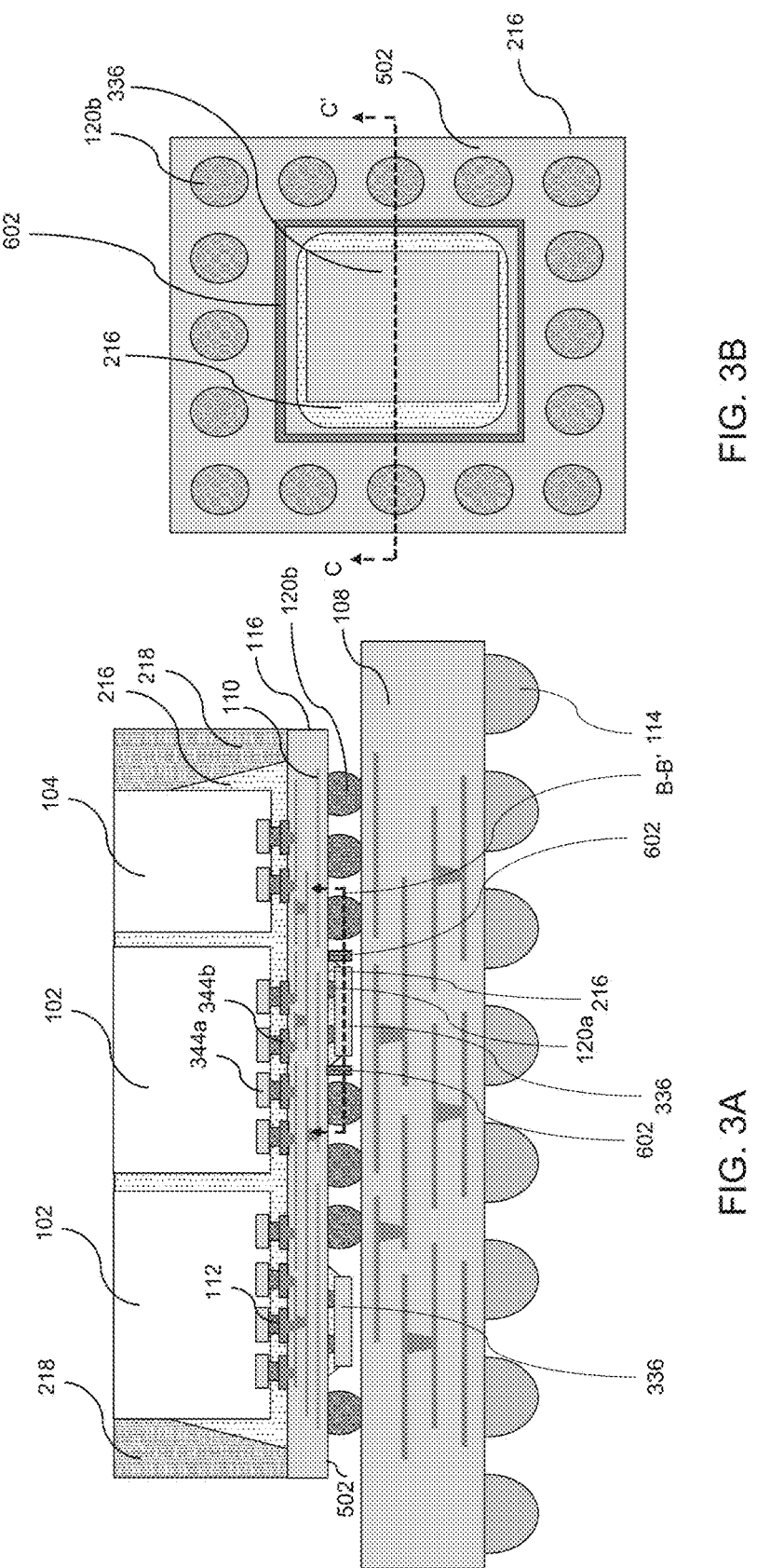
FIG. 3A is a vertical cross-sectional view of an exemplary semiconductor package assembly having a fan-out wafer-level package including a plurality of semiconductor dies, an integrated passive device, and a dam, according to various embodiments.
FIG. 3B is a bottom view of a portion of the exemplary semiconductor package assembly of FIG. 3A such that the plane of the figure is parallel to the cross-sectional plane B-B' shown in FIG. 3A, according to various embodiments.

FIG. 3A is a vertical cross-sectional view of a semiconductor package assembly 300 having a fan-out wafer-level package including a plurality of semiconductor dies (102, 104), an integrated passive device 336, and a dam 602, according to various embodiments. FIG. 3B is a bottom view of a portion of the semiconductor package assembly 300 of FIG. 3A such that the plane of the figure is parallel to the cross sectional plane B-B' shown in FIG. 3A, according to various embodiments. The dam 602 may be configured to protrude from the first side 502 of the interposer 116, as shown in FIG. 3A, and described in greater detail, below. Further, as shown in FIG. 3B, the dam 602 may be configured to constrain a spatial extent of the at least one underfill material portion 216 by forming a connected boundary of a two-dimensional region of the first side 502 of the interposer 116 as viewed in a plan view. In this way, the at least one underfill material portion 216 may be prevented from contacting the solder portions 120b.

Figures 3C, 3D:
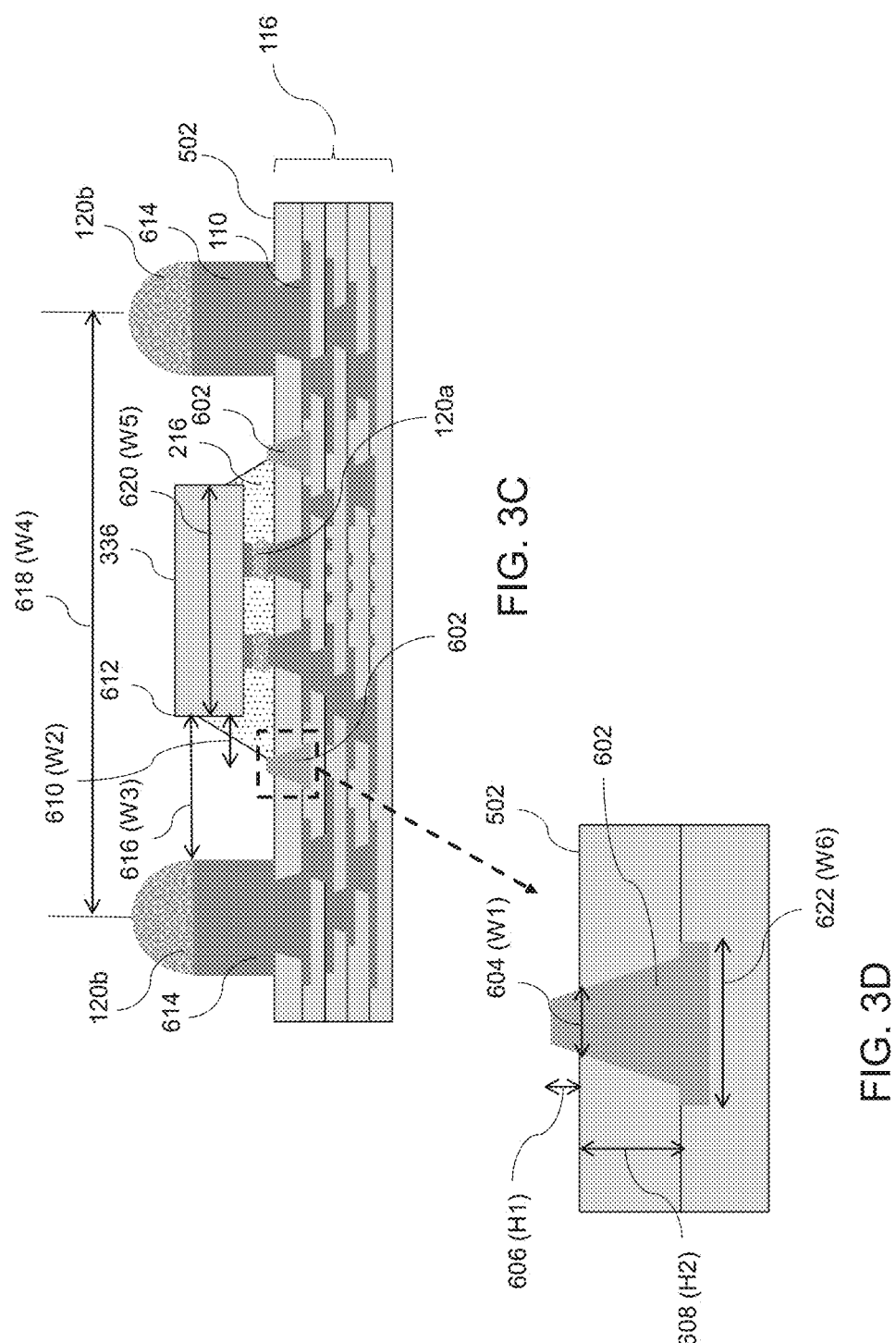
FIG. 3C is a vertical cross-sectional view of a portion of the interposer of FIGS. 3A and 3B, defined by the cross-section C-C' indicated in FIG. 3B, according to various embodiments.
FIG. 3D is an enlarged view of a portion of the dam shown in FIGS. 3A to 3C, according to various embodiments.

FIG. 3C is a vertical cross-sectional view of a portion of the interposer 116 of FIGS. 3A and 3B, defined by the cross-section C-C' indicated in FIG. 3B, according to various embodiments. FIG. 3D is an enlarged view of a portion of the dam shown in FIGS. 3A to 3C, according to various embodiments. As shown in FIGS. 3C and 3D, the dam 602 protrudes from the first side 502 of the interposer 116 and may have a first portion extending above a surface of the first side 502 of the interposer and a second portion embedded below the surface of the first side 502 of the interposer. The first portion may have a first width W1 604 and a first height H1 606. The second portion may have a second height H2 608. The first height H1 606 may have a value in a first range from approximately 1 micron to approximately 15 microns. The second height H2 608 may have a value H2 608 such that a ratio H1/H2 of the first height H1 606 to the second height H2 608 has a value in a second range from approximately 0.1 to approximately 0.5. The first width W1 604 may have a value that is in a third range from approximately 5 microns to approximately 50 microns.

As shown in FIG. 3C, the dam 602 may be separated by a second width W2 610 from a first edge 612 of the integrated passive device 336. The second width W2 610 may have a value in a fourth range from approximately 10 microns to approximately 200 microns. As such, the dam 602 may act to constrain the underfill material portion 216 to a spatial region that is within the second width W2 610 of the integrated passive device 336. As shown in FIG. 3C, the first side 502 of the interposer 116 may include a plurality of bonding structures 614 having solder portions 120b. The first edge 612 of the integrated passive device 336 may be separated by a third width W3 616 from one of the plurality of bonding structures 614, as shown. The third width W3 616 may have a value such that a ratio W2/W3 of the second width W2 610 to the third width W3 616 is in a fifth range from approximately 0.1 to approximately 0.8.

According to an embodiment, the plurality of bonding structures 614 may have a pitch that spans a fourth width W4 618 that is in a sixth range from approximately 50 microns to approximately 200 microns. The integrated passive device 336 may have a fifth width W5 620 that has a value in a seventh range from approximately 500 microns to approximately 4,000 microns. The second portion of the dam 602 (e.g., see FIG. 3D) may have a sixth width W6 622 that is in an eighth range from approximately 5 microns to approximately 50 microns, as shown in FIG. 3D. Also, as shown in FIGS. 3C and 3D, the dam 602 may be formed in the interposer 116 and may be partially embedded in a dielectric layer that also includes a component of a redistribution interconnect structure 110, as described in greater detail with reference to FIGS. 4 to 11, below.

Figure 3F:
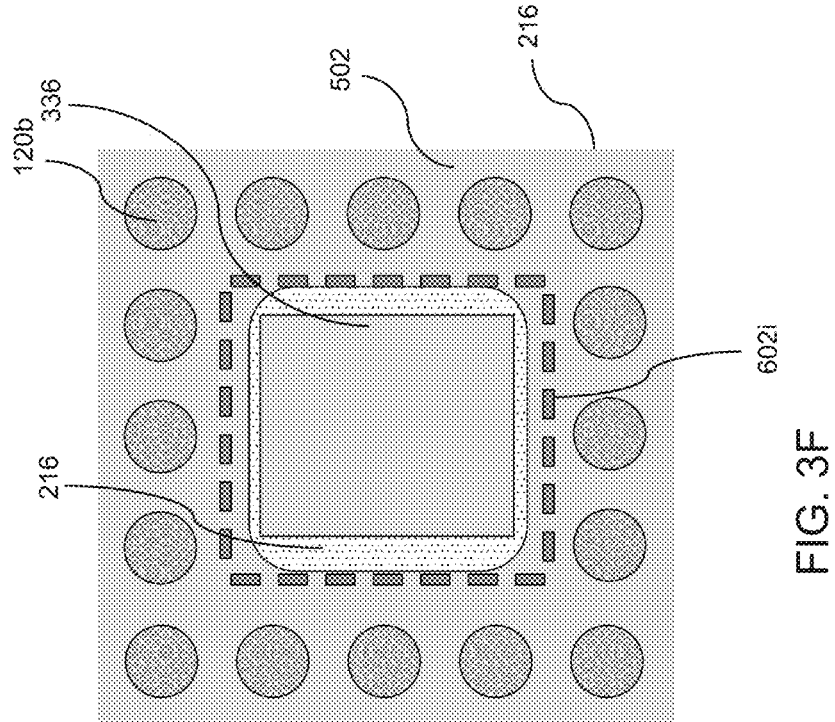
FIG. 3F is a bottom view of a portion of an exemplary semiconductor package assembly similar to that of FIG. 3A showing a further dam having a plurality of disconnected segments, according to various embodiments.
Figure 3E:
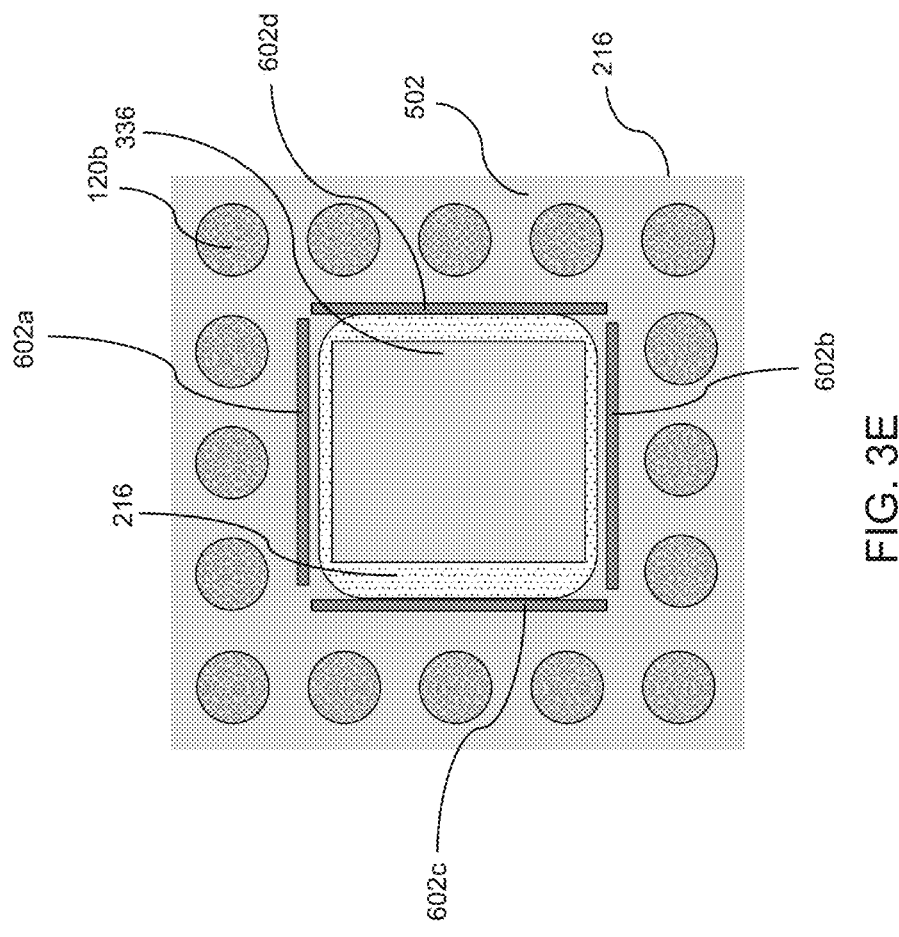
FIG. 3E is a bottom view of a portion of an exemplary semiconductor package assembly similar to that of FIG. 3A showing a dam having a plurality of disconnected segments, according to various embodiments.

FIG. 3E is a bottom view of a portion of an exemplary semiconductor package assembly similar to that of FIG. 3A showing a dam having a plurality of disconnected segments of the dam (e.g., 602a, 602b, 602c, 602d), and FIG. 3F is a bottom view of a portion of an exemplary semiconductor package assembly similar to that of FIG. 3A showing a further dam having a plurality of disconnected segments 602i, according to various embodiments. In each embodiment, the dam (602a, 602b, 602c, 602d, 602i) forms a boundary of a two-dimensional region of the first side of the interposer as viewed in a plan view (i.e., in the bottom views shown in FIGS. 3E and 3F). In an example embodiment, the disconnected segments 602i of the dam of FIG. 3F may each have square or rectangular cross section with characteristic lengths of the order of 20 microns (e.g., 20 microns by 20 microns square segments 602i).

Embodiments in which the dam may include disconnected segments of the dam (e.g., 602a, 602b, 602c, 602d, 602i) may be advantageous in reducing stresses due to thermal expansion during various processing steps. For example, the dam 602 in FIG. 3B may develop thermal expansion stress concentrations at the corners of the dam 602. In contrast, the dam (602a, 602b, 602c, 602d) of FIG. 3E may avoid such stress concentrations because the corners are disconnected. Similarly, the dam of FIG. 3F that may include the plurality of disconnected segments 602i may similarly avoid stress concentrations that may otherwise arise in the four segments 602a, 602b, 602c, and 602d of the dam shown in FIG. 3E. The sizes and separations of the disconnected segments of the dam (e.g., 602a, 602b, 602c, 602d, 602i) of the dams of FIGS. 3E and 3F may be dictated by the properties of the underfill material portion 216. For example, viscosity and surface tension of the underfill material portion 216 may prevent the underfill material portion 216 from leaking out of the dams of FIGS. 3E and 3F provided that the gaps between the disconnected segments of the dam (e.g., 602a, 602b, 602c, 602d, 602i) are sufficiently small. For example, if the gaps between the disconnected segments of the dam (e.g., 602a, 602b, 602c, 602d, 602i) are 10 microns or smaller leakage of the underfill material portion 216 may be avoided.

FIG. 4 is an intermediate structure 400 that may be used in the formation of a semiconductor package assembly, according to various embodiments. The intermediate structure 400 may include a first carrier substrate 212a with a first redistribution dielectric layer 704a formed thereon. The first carrier substrate 212a may include a semiconductor substrate, an insulating substrate, or a conductive substrate. The first carrier substrate 212a may be transparent or opaque. The first carrier substrate 212a may have a thickness that is sufficient to provide mechanical support to an interposer 116 (e.g., see FIGS. 2A, 3A, and 3C) to be subsequently formed thereupon. For example, the first carrier substrate 212a may have a thickness in a range from approximately 60 microns to approximately 1 mm. Alternative embodiments may include carrier substrates having a larger or smaller thickness.

The intermediate structure 400 of FIG. 4 may include a first adhesive layer 214*a* applied to a top surface of the first carrier substrate 212*a*. In various embodiments, the first carrier substrate 212*a* may include an optically transparent material such as glass or sapphire. In this example, the first adhesive layer 214*a* may include a light-to-heat conversion (LTHC) layer. The LTHC layer may be a solvent-based coating applied using a spin coating method. The LTHC layer may form a layer that converts ultraviolet light to heat such that the LTHC layer loses adhesion. Alternatively, the first adhesive layer 214*a* may include an adhesive material that is configured to be thermally decomposed. For example, the first adhesive layer 214*a* may include an acrylic pressure-sensitive adhesive that decomposes at an elevated temperature. The thermally decomposing adhesive material may have a debonding temperature that is in a range from approximately 150° F. to approximately 400° F. Other suitable thermally decomposing adhesive materials that decompose at other temperatures are within the contemplated scope of disclosure.

As shown in FIG. 4, a first redistribution interconnect layer 110*a* may be formed in the first redistribution dielectric layer 704*a*. The dam 602 may also be formed in the first redistribution dielectric layer 704*a*. The first redistribution dielectric layer 704*a* may be a dielectric polymer material such as PI, BCB, or PBO. The first redistribution dielectric layer 704*a* may be formed by spin coating and drying of dielectric polymer material.

The thickness of the first redistribution dielectric layer 704*a* may be in a range from approximately 2 microns to approximately 40 microns, such as from 4 microns to 20 microns. The first redistribution dielectric layer 704*a* may be patterned, for example, by applying and patterning a respective photoresist layer thereabove (not shown), and by transferring the pattern in the photoresist layer into the first redistribution dielectric layer 704*a* using an etch process such as an anisotropic etch process. The photoresist layer may be subsequently removed, for example, by ashing.

The redistribution interconnect layer 110*a* and the dam 602 may be may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 150 nm, and the copper seed layer may have a thickness in a range from 100 nm to 500 nm. The metallic fill material for the die-side redistribution interconnect layer 110*a* may include copper, nickel, or copper and nickel. In many embodiments, the redistribution interconnect layer 110*a* and the dam 602 may be formed in a common process by depositing a common (same) metallic seed layer by sputtering, by applying and patterning a photoresist layer over the metallic seed layer to form a pattern of openings through the photoresist layer, by electroplating a common metallic fill material (such as copper, nickel, or a stack of copper and nickel), by removing the photoresist layer (for example, by ashing), and by etching portions of the common metallic seed layer located between the electroplated metallic fill material portions. Thus, the redistribution interconnect layer 110*a* and the dam 602 may have a common material. In other embodiments, the redistribution interconnect layer 110*a* and the dam 602 may be formed in a different process by depositing different metallic seed layers in separate processes by sputtering, by applying and patterning a photoresist layer over the different metallic seed layers to form a pattern of openings through the photoresist layer, by electroplating the different metallic fill materials (such as copper, nickel, or a stack of copper and nickel), by removing the photoresist layer (for example, by ashing), and by etching portions of the different metallic seed layers located between the electroplated metallic fill material portions. Thus, in these other embodiments, the redistribution interconnect layer 110*a* and the dam 602 may be formed from different materials.

FIG. 5 is a further intermediate structure 500 that may be used in the formation of a semiconductor package assembly, according to various embodiments. The intermediate structure 500 may be formed from the intermediate structure 400 of FIG. 4 by forming additional redistribution dielectric layers (e.g., 704*b*, 704*c*, 704*d*, 704*e*) and redistribution interconnect layers (110*b*, 110*c*, 110*d*, 110*e*) over the first redistribution dielectric layer 704*a* and the first redistribution interconnect layer 110*a*. Each addition redistribution dielectric layer (704*b*, 704*c*, 704*d*, 704*e*) may be formed by spin coating and drying of the respective dielectric polymer material. The thickness of each additional redistribution dielectric layer (704*b*, 704*c*, 704*d*, 704*e*) may be in a range from approximately 2 microns to approximately 40 microns, such as from 4 microns to 20 microns.

Each additional redistribution dielectric layer (704*b*, 704*c*, 704*d*, 704*e*) may be patterned, for example, by applying and patterning a respective photoresist layer thereabove, as described above for the first redistribution dielectric layer 704*a*. The photoresist layer may be subsequently removed, for example, by ashing. Although, in this example embodiment, the intermediate structure 500 may include five redistribution dielectric layers (704*a*, 704*b*, 704*c*, 704*d*, 704*e*) and five redistribution interconnect layer (110*a*, 110*b*, 110*c*, 110*d*, 110*e*), greater or fewer numbers of redistribution dielectric layers and redistribution interconnect layers may be provided in other embodiments.

Also, as shown in FIG. 5, bonding pads 334*b* may be formed as part of the last redistribution interconnect layer 110*e*. Solder portions 112 may further be formed over the bonding pads 334*b*. Each of the redistribution interconnect layers (110*a*, 110*b*, 110*c*, 110*d*, 110*e*) and the bonding pads 344*b* may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions, as described above.

The thickness of the metallic fill material that is deposited for each redistribution interconnect layers (110*a*, 110*b*, 110*c*, 110*d*, 110*e*) may be in a range from approximately 2 microns to approximately 40 microns, such as from 4 microns to 20 microns, although smaller or larger thicknesses may also be used. The total number of levels of wiring in each redistribution interconnect layers (110*a*, 110*b*, 110*c*, 110*d*, 110*e*) (i.e., the levels of the die-side redistribution interconnect structure 110 of FIGS. 2A, 3A, and 3C) may be in a range from 1 to 12, such as from 2 to 5. The total height of the redistribution interconnect layers (110*a*, 110*b*, 110*c*, 110*d*, 110*e*) may be in a range from 30 microns to 300 microns, although smaller or larger heights may also be used.

In one embodiment, the thicknesses of the redistribution dielectric layers (704a, 704b, 704c, 704d, 704e) and redistribution interconnect layers (110a, 110b, 110c, 110d, 110e) may be selected such that the redistribution interconnect layers (110a, 110b, 110c, 110d, 110e) provided at different wiring levels have different thicknesses. Thick redistribution interconnect layers (e.g., the first redistribution interconnect layer 110a) may be used to provide low resistance conductive paths. Thin die-side redistribution interconnect layers (e.g., the fifth redistribution interconnect layer 110e) may be used to provide shielding from electromagnetic interference.

The above description of FIGS. 4 and 5 relates to embodiments in which the interposer 116 (e.g., see FIGS. 2A, 3A, and 3C) is formed as an organic interposer. In other embodiments, the interposer 116 may be formed as an silicon interposer using back-end-of-line (BEOL) semiconductor device processing techniques.

For example, the redistribution interconnect layers (110a, 110b, 110c, 110d, 110e) and the dam 602 may be formed by a dual-Damascene process or by multiple single Damascene processes. Single-Damascene processes generally form and fill a single feature with copper per Damascene stage. Dual-Damascene processes generally form and fill two features with copper at once. For example, a trench and overlapping through-hole may both be filled with a single copper deposition using dual-Damascene processes. In alternative embodiments, the redistribution interconnect layers (110a, 110b, 110c, 110d, 110e) and the dam 602 may be formed by an electroplating process, as described above with reference to formation of the organic interposer.

The redistribution dielectric layers (704a, 704b, 704c, 704d, 704e) may be formed by successive deposition and patterning of a dielectric material such as silicon oxide, silicon nitride, silicon carbide, etc., using a deposition process such as PECVD. Each of the redistribution dielectric layers (704a, 704b, 704c, 704d, 704e) may be patterned by applying a photoresist (not shown) and patterning the photoresist using optical lithography techniques. The patterned photoresist may then be used to form openings, such as trenches and/or though-holes (e.g., via holes). The openings may be formed, for example, by etching the redistribution dielectric layers (704a, 704b, 704c, 704d, 704e) using an anisotropic etch (e.g., by performing a reactive ion etch).

A deposition process may be performed to deposit a conductive metal (e.g., copper) in the openings. A planarization process, such as chemical-mechanical planarization (CMP) may then be performed to remove excess copper (e.g., overburden) that is disposed on top of the redistribution dielectric layers (704a, 704b, 704c, 704d, 704e). The patterning, metal deposition, and planarizing processes may be performed for each of the redistribution dielectric layers (704a, 704b, 704c, 704d, 704e), to thereby form the redistribution interconnect layers (110a, 110b, 110c, 110d, 110e) and/or the dam 602.

Figures 6, 7:
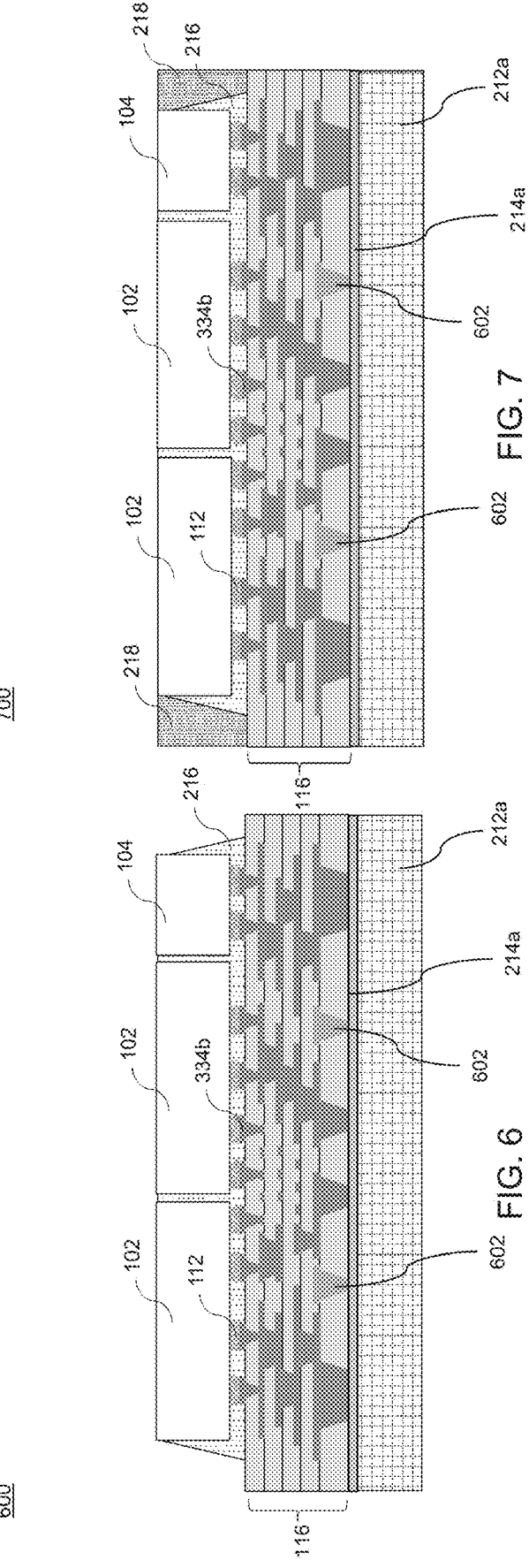
FIG. 6 is a vertical cross-sectional view of a further intermediate structure that may be used in the formation of a semiconductor package assembly, according to various embodiments.
FIG. 7 is a vertical cross-sectional view of a further intermediate structure that may be used in the formation of a semiconductor package assembly, according to various embodiments.

FIG. 6 illustrates a further intermediate structure 600 that may be used in the formation of a semiconductor package assembly, according to various embodiments. In this regard, a first plurality of semiconductor dies 102 and a second plurality of semiconductor dies 104 may be coupled to the interposer 116. Each of the first plurality of semiconductor dies 102 and the second plurality of semiconductor dies 104 may be a SoC die, an HBM die, an integrated passive device die, etc. In further embodiments, one or more of the first plurality of semiconductor dies 102 and the second plurality of semiconductor dies 104 may be a serializer/de-serializer device die. Each of the first plurality of semiconductor dies 102 and the second plurality of semiconductor dies 104 may be attached to the bonding pads 344b of the interposer 116 through at least one array of first solder material portions 112.

At least one underfill material portion 216 may be formed around each bonded array of first solder material portions 112. Each underfill material portion 216 may be formed by injecting an underfill material around the array of first solder material portions 112 after the first solder material portions 112 are reflowed. Various underfill material application methods may be used, which may include, for example, a capillary underfill method, a molded underfill method, or a printed underfill method.

FIG. 7 illustrates a further intermediate structure 700 that may be used in the formation of a semiconductor package assembly, according to various embodiments. The intermediate structure 700 may include an EMC material that may be applied to gaps formed between the interposer 116 and the first plurality of semiconductor dies 102 and the second plurality of semiconductor dies 104 to thereby form an EMC frame 218. The EMC material may include an epoxy-containing compound that may be hardened (i.e., cured) to provide a dielectric material portion having sufficient stiffness and mechanical strength. The EMC material may include epoxy resin, hardener, silica (as a filler material), and other additives. The EMC material may be provided in a liquid form or in a solid form depending on the viscosity and flowability.

Liquid EMC may provide better handling, good flow ability, fewer voids, better fill, and fewer flow marks. Solid EMC may provide less cure shrinkage, better stand-off, and less die drift. A high filler content (such as 85% in weight) within an EMC material may shorten the time in mold, lower the mold shrinkage, and reduce the mold warpage. A uniform filler size distribution in the EMC material may reduce flow marks, and may enhance flowability. The curing temperature of the EMC material may be lower than the release (debonding) temperature of the first adhesive layer 214a. For example, the curing temperature of the EMC material may be in a range from 125° C. to 150° C.

The EMC frame 218 may be cured at a curing temperature to form an EMC matrix that laterally encloses each of the first plurality of semiconductor dies 102 and the second plurality of semiconductor dies 104. The EMC matrix may include a plurality of EMC frames 218 that may be laterally adjoined to one another. Each EMC frame 218 may be configured to laterally surrounds and embed a respective one of the first plurality of semiconductor dies 102 and the second plurality of semiconductor dies 104. Excess portions of the EMC frame 218 may be removed from above the horizontal plane including the top surfaces of the semiconductor device dies 104 by a planarization process, such as CMP.

FIG. 8 illustrates a further intermediate structure 800 that may be used in the formation of a semiconductor package assembly, according to various embodiments. The intermediate structure 800 may be formed from the intermediate structure 700 of FIG. 7 by attaching a second carrier substrate 212b to the first plurality of semiconductor dies 102 and the second plurality of semiconductor dies 104, removing the first carrier substrate 212a, and flipping the resulting structure over such that the first side 502 of the interposer 116 is facing upward as shown, for example, in FIG. 8.

The first carrier substrate 212a (e.g., see FIGS. 4 to 7) may be detached from the assembly of the interposer 116, the first plurality of semiconductor dies 102 and the second plurality of semiconductor dies 104, and the EMC frames 218, by deactivating the first adhesive layer 214a. In this regard, the first adhesive layer 214a may be deactivated, for example, by performing a thermal anneal process at an elevated temperature. In various embodiments, the first adhesive layer 214amay include a thermally-deactivated adhesive material. In other embodiments in which the first carrier substrate 212a may be transparent, the first adhesive layer 214a may include an ultraviolet-deactivated adhesive material.

The second carrier substrate 212b may have similar properties to that of the first carrier substrate 212a. In this regard, the second carrier substrate 212b may include a semiconductor substrate, an insulating substrate, or a conductive substrate. The second carrier substrate 212b may be transparent or opaque. The second carrier substrate 212b may have a thickness that is sufficient to provide mechanical support to intermediate structure 800 (e.g., see FIG. 8) and to the intermediate structures 900 and 1000 (e.g., see FIGS. 9 and 10 and related description, below) and the semiconductor package assembly 1100 (e.g., see FIG. 11) to be subsequently formed thereupon. For example, the second carrier substrate 212b may have a thickness in a range from approximately 60 microns to approximately 1 mm. Alternative embodiments may include carrier substrates having a larger or smaller thickness.

The intermediate structure 800 of FIG. 8 may further include a second adhesive layer 214b applied to a top surface of the second carrier substrate 212b. In various embodiments, the second carrier substrate 212b may include an optically transparent material such as glass or sapphire. In this example, the second adhesive layer 214b may include a LTHC layer that is configured to convert ultraviolet light to heat such that the LTHC layer loses adhesion, as described above with reference to the first adhesive layer 214a. Alternatively, the second adhesive layer 214b may include an adhesive material that is configured to be thermally decomposed (e.g., having a debonding temperature that is in a range from approximately 150° F. to approximately 400° F.) as described above. Other suitable thermally decomposing adhesive materials that decompose at other temperatures are within the contemplated scope of disclosure.

FIG. 9 illustrates a further intermediate structure 900 that may be used in the formation of a semiconductor package assembly, according to various embodiments. The intermediate structure 900 may be formed from the intermediate structure 800 of FIG. 8 by performing an etch process to etch a portion of the topmost redistribution dielectric layer 704e to expose the first portion of the dam 602 (e.g., see FIG. 3D and related description, above). As described above with reference to FIG. 3D, the first portion of the dam 602 may have a height H1 606 that may have a value in the first range from approximately 1 micron to approximately 15 microns. As such, the etch process may be configured to remove a similar thickness of the topmost redistribution dielectric layer 704e, thereby exposing a similar thickness of various portions of the topmost redistribution interconnect layer 110e.

The exposed portions of the topmost redistribution interconnect layer 110e may include a first plurality of metal features 1202 and a second plurality of metal features 1204. Just as with the dam 602, the first plurality of metal features 1202 and the second plurality of metal features 1204 may have a first portion that is exposed above a surface of the first side 502 of the interposer 116, including a surface of the topmost redistribution dielectric layer 704e, and a second portion that is embedded in the topmost redistribution dielectric layer 704e.

The first plurality of metal features 1202 and the second plurality of metal features 1204 may be electrically connected to other layers of the redistribution interconnect layers (110a, 110b, 110c, 110d). As such, the first plurality of metal features 1202 and the second plurality of metal features 1204 may be electrically connected to the first plurality of semiconductor dies 102 and the second plurality of semiconductor dies 104 through electrical connections formed with the bonding pads 344a (e.g., see FIG. 3A). The dam 602 may be electrically isolated from the redistribution interconnect layers (110a, 110b, 110c, 110d, 110e). As described in further detail, below, the first plurality of metal features 1202 and the second plurality of metal features 1204 may be configured as bonding structures.

Figures 10, 11:
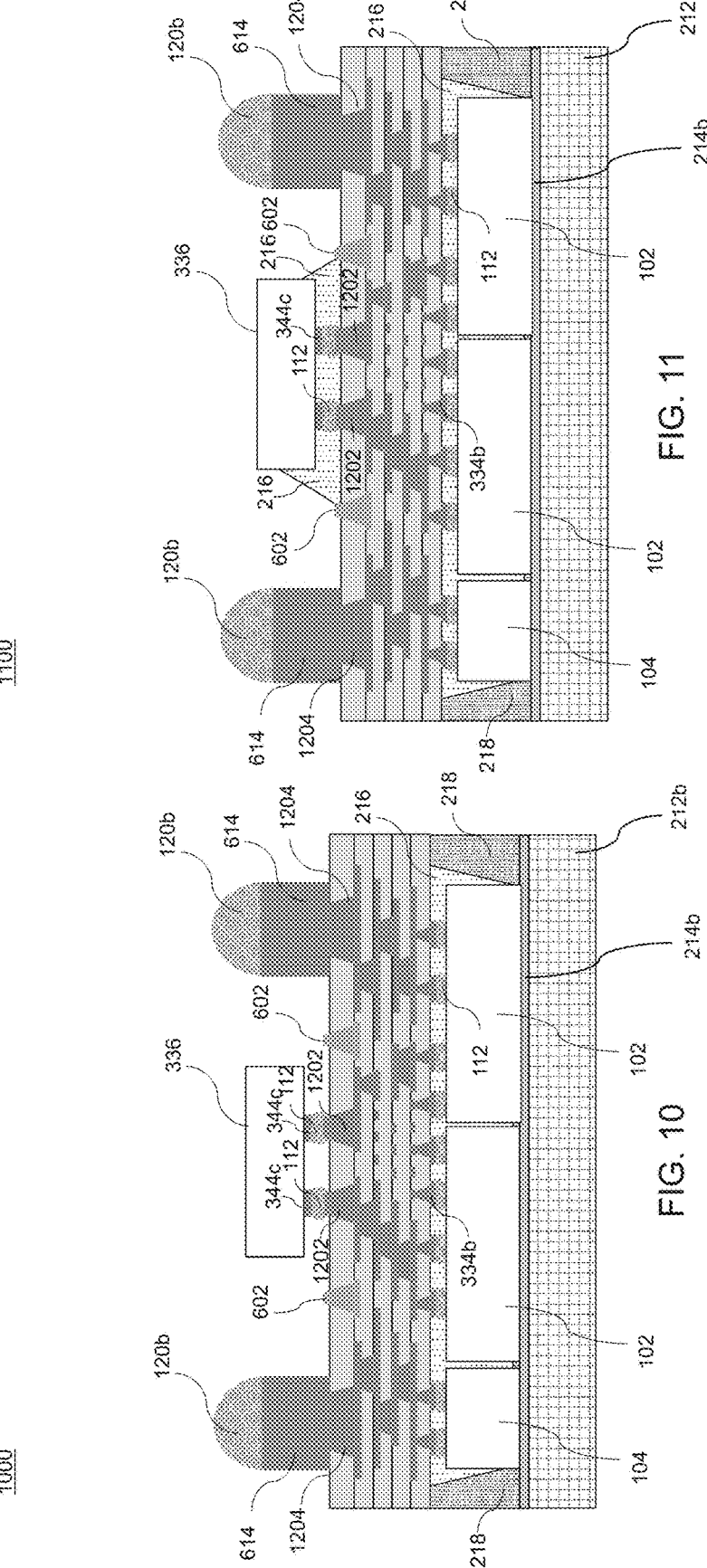
FIG. 10 is a vertical cross-sectional view of a further intermediate structure that may be used in the formation of a semiconductor package assembly, according to various embodiments.
FIG. 11 is a vertical cross-sectional view of a semiconductor package assembly, according to various embodiments.

FIG. 10 illustrates a further intermediate structure 1000 that may be used in the formation of a semiconductor package assembly, according to various embodiments. The intermediate structure 1000 may be formed from the intermediate structure 900 of FIG. 9 by forming the plurality of bonding structure 614 and by attaching an integrated passive device 336 to the first plurality of metal features 1202. In this regard, the plurality of bonding structures 614 may be formed over the second plurality of metal features 1204 by using techniques similar to those described above for formation of the redistribution interconnect layers (110a, 110b, 110c, 110d, 110e). In this regard, a mask layer (not shown) may deposited over the intermediate structure 900 and may be patterned to form a patterned mask layer (e.g., a patterned dielectric layer or a patterned photoresist). A metal layer may then be deposited in via structures formed in the patterned mask layer to thereby form the bonding structure 614 over the second plurality of metal features 1204. Solder portions 120b may then be provided over the bonding structures 614. As such, the bonding structures 614 may be configured C4 bump structures.

The patterned mask layer may then be removed by etching to reveal the first portions of the dam 602 and the first plurality of metal features 1202. The first plurality of metal features 1202 may be configured as micro bumps configured to bond the integrated passive device 336 to the interposer 116. In this regard, a first plurality of solder portions 112 may be provided on top surfaces of the first plurality of metal features 1202. The integrated passive device 336 may then be bonded to the first plurality of metal features 1202 such that package side bonding pads 344c of the integrated passive device 336 may be bonded to the first plurality of metal features 1202. In this regard, a reflow operation may be performed to cause the first plurality of solder portions to melt and to thereby form a bond between the first plurality of metal features 1202 and the package side bonding pads 344c.

FIG. 11 illustrates a semiconductor package assembly 1100, according to various embodiments. The semiconductor package assembly 1100 may be formed from the intermediate structure 1000 of FIG. 10 by the formation of an underfill material portion 216. As described above, the underfill material portion 216 may be formed by injecting an underfill material around the first plurality of solder portions 112 that may be coupled to the first plurality of metal features 1202 after the solder portions 112 are reflowed. Various underfill material application methods may be used, which may include, for example, a capillary underfill method, a molded underfill method, or a printed underfill method. As described above, the dam 602 may be configured to constrain a spatial extent of the underfill material portion 216. As such, the underfill material portion 216 may be prevented from making physical contact with the bonding structure 614.

FIG. 12 is a flowchart showing various operations of a method 1200 of fabricating semiconductor device structure, according to various embodiments. In a first operation 1210, the method 1200 may include forming a first dielectric layer (e.g., redistribution dielectric layer 704a) on a carrier substrate (e.g., the first carrier substrate 212a). In operation 1220, the method 1200 may include forming a dam 602 and a first portion of a redistribution interconnect structure (e.g., first redistribution interconnect layer 110a) in the first dielectric layer 704a. In operation 1230, the method 1200 may include forming one or more additional dielectric layers (e.g., redistribution dielectric layers (704b, 704c, 704d, 704e)) and one or more respective additional portions of the redistribution interconnect structure (e.g., redistribution interconnect layers 110b, 110c, 110d, 110e). In operation 1240, the method 1200 may include removing the first carrier substrate 212a to reveal a first side 502 of the interposer 116 including a package side dielectric layer (e.g., the first dielectric layer 704a). In operation 1250, the method 1200 may include removing a portion of the package side dielectric layer (e.g., the first dielectric layer 704a) to expose a first portion of the dam 602 such that the dam 602 includes the first portion extending above the first side 502 of the interposer 116 and a second portion embedded below the first side 502 of the interposer 116 (e.g., see FIG. 3D).

In other embodiments, the method 1200 may further include forming a first plurality of bonding structures (e.g., first plurality of metal features 1202) on the redistribution interconnect structure 110 such that the first plurality of bonding structures are configured to protrude from the first side 502 of the interposer 116; electrically connecting an integrated passive device 336 to the first plurality of bonding structures 1202; and dispensing an underfill material portion 216 such that the underfill material portion 216 is configured to form in a volume between the integrated passive device 336 and the first side 502 of the interposer 116. In this way, the dam 602 may be configured to constrain a spatial extent of the underfill material portion 216.

In other embodiments, the method 1200 may further include forming a via in the first dielectric layer (e.g., redistribution dielectric layer 704a); and depositing a conductive material in the via to thereby form the dam 602 (e.g., see FIG. 4). The method 1200 may further include configuring the dam 602 to have a shape that forms a boundary of a two-dimensional region of the first side 502 of the interposer 116 as viewed in a plan view (e.g., see FIGS. 3B, 3E, and 3F). As such, the dam 602 may be configured to form one of: a connected boundary (e.g., see FIG. 3B) that encloses a rectangular region of the first side 502 of the interposer 116 as viewed in the plan view; and a disconnected boundary (e.g., see FIGS. 3E and 3F) including a plurality of disconnected segments of the dam (e.g., 602a, 602b, 602c, 602d, 602i).

In other embodiments, the method 1200 may further include forming a second plurality of bonding structures (e.g., bonding pads 344b) on the redistribution interconnect structure 110 such that the second plurality of bonding pads 344b are configured to protrude from a second side of the interposer 116 (e.g., see FIGS. 3A and 5 to 11), and electrically bonding one or more semiconductor dies (102, 104) to the second plurality of bonding pads 344b. In some embodiments, forming a second plurality of bonding structures (e.g., bonding pads 344b) on the redistribution interconnect structure 110 and electrically bonding one or more semiconductor dies (102, 104) to the second plurality of bonding pads 344b may be performed prior to removing the carrier substrate (e.g., the first carrier substrate 212a).

Referring to all drawings and according to various embodiments of the present disclosure, a semiconductor package assembly (300, 1100) (e.g., see FIGS. 3A and 11) is provided. The semiconductor package assembly (300, 1100) may include an interposer 116; an integrated passive device 336 electrically coupled to a first side 502 of the interposer 116; an underfill material portion 216 formed between the integrated passive device 336 and the first side 502 of the interposer 116; and a dam 602 protruding from the first side 502 of the interposer 116 and configured to constrain a spatial extent of the underfill material portion 216.

The dam 602 may include a first portion extending above a surface of the first side 502 of the interposer 116 and a second portion embedded below the surface of the first side 502 of the interposer 116 (e.g., see FIG. 3D). The first portion may include a first height H1 606 that is in a first range from approximately 1 micron to approximately 15 microns, and the second portion may include a second height H2 608 such that a ratio H1/H2 of the first height H1 606 to the second height H2 608 is a second range from approximately 0.1 to approximately 0.5.

The first portion of the dam 602 may include a first width W1 604 that is in a third range from approximately 5 microns to approximately 50 microns. The dam 602 may be separated by a second width W2 610 from a first edge 612 of the integrated passive device 336, and the second width W2 610 may have a value in a fourth range from approximately 10 microns to approximately 200 microns. The first side 502 of the interposer 116 may further include a plurality of bonding structures 614, such that the first edge 612 of the integrated passive device 336 is separated by a third width W3 616 from one of the plurality of bonding structures 614. A ratio W2/W3 of the second width W2 610 to the third width W3 616 may be in a fifth range from approximately 0.1 to approximately 0.8.

The plurality of bonding structures 614 may be configured to have a pitch that spans a fourth width W4 618 that is in a sixth range from approximately 50 microns to approximately 150 microns, or from approximately 50 microns to approximately 200 microns. The integrated passive device 336 may include a fifth width W5 620 that is in a seventh range from approximately 500 microns to approximately 4,000 microns. The second portion of the dam 602 may include a sixth width W6 622 that is in an eighth range from approximately 5 microns to approximately 50 microns (e.g., see FIG. 3D). As shown, for example in FIGS. 4 to 11, the dam 602 may be formed in the interposer 116 such as to be partially embedded in a dielectric layer (e.g., redistribution dielectric layer 704a) that also includes a component of a redistribution interconnect structure 110 (e.g., first redistribution interconnect layer 110a). In one embodiment, the dam 602 and the redistribution interconnect structure 110 may be formed from a common material.

In further embodiments (e.g., see FIG. 5) an interposer 116 may be provided. The interposer 116 may include one or more dielectric layers (e.g., redistribution dielectric layers (704b, 704c, 704d, 704e)); a redistribution interconnect structure 110 (e.g., redistribution interconnect layers (110a, 110b, 110c, 110d, 110e) formed in the one or more dielectric layers; a first plurality of bonding structures (e.g., first plurality of metal features 1202) formed on a first side 502 of the interposer 116 and electrically connected to the redistribution interconnect structure 110; and a dam 602 protruding from the first side 502 of the interposer 116. The first plurality of bonding pads 344*e* structures 1202 may be configured to electrically connect an integrated passive device 336 to the interposer 116.

The interposer 116 may further include an integrated passive device 336 coupled to the first side 502 of the interposer 116 and electrically connected to the first plurality of bonding structures 1202; and an underfill material portion 216 formed in a volume between the integrated passive device 336 and the first side 502 of the interposer 116, such that the dam 602 is configured to constrain a spatial extent of the underfill material portion 216. As described above, the dam 602 may be formed in the interposer 116 and may be partially embedded in a dielectric layer (e.g., redistribution dielectric layer 704*a*) that also includes a component of the redistribution interconnect structure (e.g., redistribution interconnect layer 110*a*). Further, as shown in FIGS. 3B, 3E, and 3F, the dam 602 may be configured to form a boundary of a two-dimensional region of the first side 502 of the interposer 116 as viewed in a plan view. In this regard, the dam 602 may be configured to form a connected boundary (e.g., see FIG. 3B) that encloses a rectangular region of the first side 502 of the interposer 116 as viewed in the plan view. Alternatively, the dam 602 may include a plurality of disconnected segments of the dam (e.g., 602*a*, 602*b*, 602*c*, 602*d*, 602*i*) that form a disconnected boundary (e.g., see FIGS. 3E and 3F).

The disclosed embodiments provide advantages over existing semiconductor package assemblies due to the presence of the dam 602 that is configured to constrain a spatial extent of the underfill material portion 216. As such, the underfill material portion 216 may be prevented from overlapping with adjacent bonding structures 614, which may otherwise reduce performance of the semiconductor package assembly. In certain embodiments, the dam 602 may include disconnected segments of the dam (e.g., 602*a*, 602*b*, 602*c*, 602*d*, 602*i*), which may be advantageous in reducing stresses due to thermal expansion during various processing steps. Further, the dam may be fabricated along with redistribution interconnect layers (110*a*, 110*b*, 110*c*, 110*d*, 110*e*) with only minimal adjustment to existing fabrication processes.

The foregoing outlines features of several embodiments so that those skilled in the art may better understand the aspects of this disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of the present disclosure.

What is claimed is:

1. A method of forming a semiconductor package assembly, comprising:
  forming an interposer by performing operations comprising:
    forming a first dielectric layer on a carrier substrate;
    forming a dam and a first portion of a redistribution interconnect structure in the first dielectric layer, wherein the dam comprises at least one tapered sidewall;
    forming one or more additional dielectric layers and one or more respective additional portions of the redistribution interconnect structure;

dispensing an underfill material portion such that the underfill material portion, wherein the dam is configured to constrain a spatial extent of the underfill material portion
    removing the carrier substrate to reveal a first side of the interposer comprising a package side dielectric layer; and
  removing a portion of the package side dielectric layer to expose a first portion of the at least one tapered sidewall such that the dam comprises the first portion extending above the first side of the interposer and a second portion of the tapered sidewall embedded below the first side of the interposer.

2. The method of claim 1, further comprising:
  forming a first plurality of bonding structures on the redistribution interconnect structure such that the first plurality of bonding structures are configured to protrude from the first side of the interposer;
  electrically connecting an integrated passive device to the first plurality of bonding structures, wherein the underfill material portion is configured to form in a volume between the integrated passive device and the first side of the interposer.

3. The method of claim 1, wherein forming the dam further comprises:
  forming a via in the first dielectric layer; and
  depositing a conductive material in the via to thereby form the dam.

4. The method of claim 1, wherein forming the dam further comprises:
  configuring the dam to have a shape that forms a boundary of a two-dimensional region of the first side of the interposer as viewed in a plan view,
  wherein the dam is configured to form one of:
    a connected boundary that encloses a rectangular region of the first side of the interposer as viewed in the plan view; or
    a disconnected boundary comprising a plurality of disconnected segments.

5. The method of claim 1, further comprising:
  forming a second plurality of bonding having tapered sidewalls structures on the redistribution interconnect structure such that the second plurality of bonding structures are configured to protrude from a second side of the interposer; and
  electrically bonding one or more semiconductor device dies to the second plurality of bonding structures.

6. A method of forming a semiconductor package assembly, comprising:
  forming a first dielectric layer;
  forming a dam and a first portion of a redistribution interconnect structure in the first dielectric layer;
  etching back a portion of the first dielectric layer to expose a top portion of the dam, wherein the top portion of the dam includes a tapered sidewall such that a width of the dam linearly decreases in a vertical direction from the top portion of the dam towards the dielectric layer;
  electrically connecting an integrated passive device to a first plurality of bonding structures located on the redistribution interconnect structure; and
  dispensing an underfill material portion such that the underfill material portion is configured to form in a volume between the integrated passive device and the first side of the interposer, wherein the top portion of the dam surrounds a perimeter of the underfill material and is configured to constrain a spatial extent of the underfill material portion.

7. The method of claim 6, further comprising:
forming one or more additional dielectric layers and one or more respective additional portions of the redistribution interconnect structure;
exposing a package side dielectric layer; and
removing a portion of the package side dielectric layer to expose a first portion of the dam.

8. The method of claim 6, wherein forming the dam further comprises:
forming a via in the first dielectric layer, wherein a bottom width of the via is larger than a top width of the via; and
depositing a conductive material in the via to thereby form the dam.

9. The method of claim 6, wherein forming the dam further comprises:
configuring the dam to have a shape that forms a boundary of a two-dimensional region of the first side of the interposer as viewed in a plan view.

10. The method of claim 9, wherein the dam is configured to form a continuous connected boundary that encloses a rectangular region of the first side of the interposer as viewed in the plan view such that the continuous connected boundary fully encloses the underfill material portion.

11. The method of claim 9, wherein the dam is configured to form a disconnected boundary comprising a plurality of disconnected segments.

12. The method of claim 6, further comprising:
forming a second plurality of bonding structures having tapered sidewalls on the redistribution interconnect structure such that the second plurality of bonding structures configured to protrude from a second side of the interposer; and
electrically bonding one or more semiconductor device dies to the second plurality of bonding structures.

13. The method of claim 7, wherein revealing the package side dielectric layer further comprises removing a carrier substrate to reveal a first side of an interposer.

14. The method of claim 7, wherein removing a portion of the package side dielectric layer further comprises exposing a first portion of the dam such that the dam comprises the first portion extending above the first side of an interposer having a first height and a second portion formed below the first side of the interposer having a second height, such that a ratio of the first height to the second height is between about 0.1 to about 0.5.

15. A method of forming a semiconductor package assembly, comprising:
forming an interposer by performing operations comprising:
forming a first dielectric layer on a carrier substrate;

forming a dam structure having a tapered sidewall and a first portion of a redistribution interconnect structure in the first dielectric layer;
forming one or more additional dielectric layers and one or more respective additional portions of the redistribution interconnect structure;
removing the carrier substrate to expose a first side of the interposer comprising a package side dielectric layer; and
removing a portion of the package side dielectric layer to expose a first portion of the dam such that the dam comprises the first portion extending above the first side of the interposer including a first tapered sidewall portion and a second portion embedded below the first side of the interposer including a second tapered sidewall portion, wherein the first tapered sidewall portion is tapered at a same angle as the second tapered sidewall portion;
electrically connecting an integrated passive device to a first plurality of bonding structures on the redistribution interconnect structure; and
dispensing an underfill material portion that is configured to form in a volume between the integrated passive device and the first side of the interposer and surrounded by the dam structure.

16. The method of claim 15, wherein forming the dam structure further comprises:
forming a via in the first dielectric layer, wherein a bottom width of the via is larger than a top width of the via; and
depositing a conductive material in the via to thereby form the dam structure, wherein the dam structure is electrically isolated from the redistribution interconnect structure.

17. The method of claim 15, wherein forming the dam structure further comprises configuring the dams to have a shape that forms a boundary of a two-dimensional region of the first side of the interposer as viewed in a plan view.

18. The method of claim 17, wherein the dam structure is configured to form a connected boundary that encloses a rectangular region of the first side of the interposer as viewed in the plan view.

19. The method of claim 17, wherein the dam structure is configured to form a disconnected boundary comprising a plurality of disconnected segments.

20. The method of claim 15, further comprising:
forming a second plurality of bonding structures having tapered sidewalls on the redistribution interconnect structure such that the second plurality of bonding structures are configured to protrude from a second side of the interposer; and
electrically bonding one or more semiconductor device dies to the second plurality of bonding structures.

* * * * *